United States Patent
Mizuguchi

(10) Patent No.: US 7,835,070 B2
(45) Date of Patent: Nov. 16, 2010

(54) SYNTHETIC QUARTZ MEMBER, EXPOSURE APPARATUS, AND METHOD OF MANUFACTURING EXPOSURE APPARATUS

(75) Inventor: Masafumi Mizuguchi, Yokohama (JP)

(73) Assignee: Nikon Corporation, Tokyo (JP)

( * ) Notice: Subject to any disclaimer, the term of this patent is extended or adjusted under 35 U.S.C. 154(b) by 682 days.

(21) Appl. No.: 11/320,961

(22) Filed: Dec. 30, 2005

(65) Prior Publication Data
US 2006/0110604 A1 May 25, 2006

Related U.S. Application Data

(63) Continuation of application No. PCT/JP2004/009839, filed on Jul. 9, 2004.

(30) Foreign Application Priority Data
Jul. 10, 2003 (JP) ............................. 2003-194824

(51) Int. Cl.
*G02B 13/14* (2006.01)
(52) U.S. Cl. .................... 359/355; 252/584; 252/588
(58) Field of Classification Search .................. None
See application file for complete search history.

(56) References Cited

U.S. PATENT DOCUMENTS

| 6,535,273 | B1 | 3/2003 | Maul | |
|---|---|---|---|---|
| 2001/0055103 | A1* | 12/2001 | Nishi | 355/53 |
| 2002/0151425 | A1* | 10/2002 | Fujinoki et al. | 501/54 |

FOREIGN PATENT DOCUMENTS

| DE | 198 29 612 A1 | 1/2000 |
|---|---|---|
| JP | A 05-047636 | 2/1993 |
| JP | A-9-227294 | 9/1997 |
| JP | A 2002-075835 | 3/2002 |
| JP | A 2003-038345 | 2/2003 |

OTHER PUBLICATIONS

E. M. Wright et al., "Spatial pattern of microchannel formation in fused silica irradiated by nanosecond ultraviolet pulses," Applied Optics, vol. 38. No. 27, pp. 5785-5788, 1999.
T. Kagami et al., "Heat treatment effect upon etch-channel formation in synthetic quartz crystals," Journal of Crystal Growth, vol. 229, pp. 270-274, 2001.

(Continued)

*Primary Examiner*—Stephone B Allen
*Assistant Examiner*—Derek S Chapel
(74) *Attorney, Agent, or Firm*—Oliff & Berridge, PLC

(57) ABSTRACT

An exposure apparatus includes an illumination optical system configured to illuminate a mask with a laser beam having a wavelength shorter than 250 nm, and a projection optical system configured to project and expose a pattern image of the mask onto an exposed substrate, in which an optical element made of a synthetic quartz member is disposed in the illumination optical system and/or the projection optical system. The synthetic quartz member satisfies the following conditions of initial transmittance relative to light having a wavelength of 150 nm being equal to or above 60% per centimeter, striae satisfying either grade 1 or grade 2 (Japan Optical Glass Industry Society Standard), an absorption coefficient $\alpha$ at 3585 $cm^{-1}$ equal to or below 0.035/cm, and the content of aluminum and lithium being equal to or below 1 and 0.5 ppm, respectively.

19 Claims, 6 Drawing Sheets

OTHER PUBLICATIONS

V. Liberman et al., "Excimer-laser-induced densification of fused silica: laser-fluence and material-grade effects on the scaling law," Journal of Non-Crystalline Solids, vol. 244, pp. 159-171, 1999.

J. J. Martin, "Estimation of Aluminum an Growth and Growth-Defect Content in Cultured Quartz by Using Infrared Absorption," Proceedings of IEEE International Frequency Control Symposium, 50th pp. 126-130, 1996.

Y. Ikuta et al., "New Silica Glass for 157 nm Lithography", 19th Annual Symposium on Photomask Technology, Sep. 15-17, 1999, vol. 3873, Sep. 1999, p. 386-391.

Japanese Industrial Standard, "Synthetic quartz crystal, JIS C 6704: 2005," Published by Japanese Standards Association, revised Jan. 20, 2005, with partial translation.

Bachheimer, "Optical (U.V.-V.I.S.-I.R.) Study of the Darkening Effect Induced By Ionizing Radiation Of Swept Synthetic Quartz," J. Phys. Chem. Solids, vol. 54, No. 11, pp. 1501-1507, 1993.

Lipson et al., "Infrared characterization of aluminum and hydrogen defect centers in irradiated quartz," J. Appl. Phys., vol. 58, No. 2, pp. 963-970, Jul. 15, 1985.

Nuttall et al., "Two Hydrogenic Trapped-Hole Species in $\alpha$-Quartz," Solid State Communications, vol. 33, pp. 99-102, 1980.

Sep. 26, 2008 European Office Action issued in European Patent Application No. 04 747 307.9.

May 11, 2010 European Office Action issued in European Patent Application No. 04 747 307.9.

A.A. Ballman et al.: "Synthetic Quartz with High Ultraviolet Transmission," Applied Optics, Jul. 1968, vol. 7, No. 7, pp. 1387-1390.

D. Chakraborty et al.: "Distribution of OH in Synthetic and Natural Quartz Crystals," Journal of Solid State Chemistry, vol. 17, pp. 305-311, 1976.

Japanese Office Action issued in Japanese Patent Application No. 2005-511548, dispatched on Jul. 28, 2010.

* cited by examiner

SYNTHETIC QUARTZ MEMBER, EXPOSURE APPARATUS, AND METHOD OF MANUFACTURING EXPOSURE APPARATUS

This application is a continuation application of International Application PCT/JP2004/009839, filed on Jul. 9, 2004, designating the U.S. and claims the benefit of priority from Japanese Patent Application No. 2003-194824 filed on Jul. 3, 2003. The entire disclosure of the prior application is hereby incorporated by reference herein in its entirety.

TECHNICAL FIELD

The present invention relates to a synthetic quartz member, which can be used as an optical element such as a prism and as various other optical elements for constituting an optical integrator in a machine applying an ultraviolet laser such as an excimer laser having a wavelength shorter than 250 nm as a light source, for example

BACKGROUND ART

A reduced projection exposure apparatus (or a photolithography machine) is mainly used for transferring patterns of an integrated circuit (IC), a large-scale integrated circuit (LSI), and the like. Along with an increase in the degree of integration of an integrated circuit, a projection optical system used in such a machine is required to possess a wider exposure area and a higher resolution throughout the exposure area. As a method of improving the resolution of the projection optical system, it is conceivable to reduce an exposure wavelength or to increase a numerical aperture (NA) of the projection optical system.

In terms of the exposure wavelength, reduction in the wavelength is now in progress by making the shift from a KrF (248 nm) excimer laser currently used as a main light source for a semiconductor exposure apparatus to an ArF (193 nm) excimer laser which is a deep ultraviolet light source. Moreover, to achieve even higher integration in the future, an $F_2$ (157 nm) laser which is vacuum ultraviolet light is now being studied.

Recently, a microchannel phenomenon representing a mechanical damage on an optical component is drawing attention. The microchannel phenomenon means a phenomenon to form a void having a diameter of several micrometers inward from a surface of an optical component (E. M. Wright et al., "Spatial pattern microchannel formation in fused silica irradiated by nanosecond ultraviolet pulses", Applied Optics, 1999, Vol. 38. p. 5785-5788).

When a microchannel is formed, light transmission of a component may be reduced by light scattering or an optical thin film may be destroyed. Accordingly, transmission property of the optical component is considerably deteriorated. The microchannel is formed by continuously irradiating some 1 billion ($10^9$) pulses of an ArF excimer laser having energy density in a practical range of several millijoules per square centimeters onto synthetic silica glass, for example. For this reason, it is necessary to implement a measure for preventing mechanical damages attributable to formation of microchannels even under normal service conditions of an exposure apparatus.

The inventors of the present invention have found out the fact that formation of the microchannel is closely related to an increase in density of silica glass and have filed a related patent application (Japanese Patent Application No. 2003-38345). The increase in density of silica glass is apt to occur more frequently as the wavelength of an irradiated beam becomes shorter. Accordingly, the microchannel becomes a serious problem as an exposure apparatus is equipped with higher resolution. Moreover, since the density of silica glass is increased without exception by irradiation of an ultraviolet laser having a high energy density, microchannels are formed in almost any kinds of silica glass when the laser exceeds a certain threshold of irradiation energy. Therefore, one conceivable measure for preventing formation of microchannels is to limit an irradiation energy density to silica glass. However, a given energy density is necessary on a resist surface in terms of a reduced projection exposure apparatus. Accordingly, there may be a case where it is not possible to suppress an output from a light source due to a design reason.

Another solution is a method of applying a transparent crystalline material, which does not cause an increase in density, to an optical component subject to irradiation of a light beam having a high energy density instead of applying silica glass. By using this method, it is possible to prevent formation of microchannels in an optical component without suppressing an output from a light source.

Industrially applicable crystalline materials having high transmittance and high chemical stability in a short wavelength range such as an excimer laser are limited. Such materials include fluorite and crystalline quartz, for example.

Fluorite ($CaF_2$) is an excellent optical material which has a cubic crystal, optical isotropy, and an optical band gap approximately equal to 12 eV (transparent up to about 100 nm). Fluorite is used as a material of a lens in a reduced projection exposure apparatus applying an ArF excimer laser as a light source. However, fluorite also possesses unfavorable features of cleavage on the (111) plane and resultant mechanical weakness. For example, fluorite is ranked at 4 on the modified Mohs hardness scale (defining 15 levels). Accordingly, fluorite has a problem of easily causing damages and the like and it is difficult to form this material into an optical element.

Meanwhile, crystalline quartz (the molecular formula: $SiO_2$) has a hexagonal crystal and an optical band gap thereof is estimated to be around 9 eV. Crystalline quartz is not cleaved and is therefore mechanically strong. For example, crystalline quartz is ranked at 8 on the modified Mohs hardness scale (defining 15 levels). Accordingly, crystalline quartz has superior workability to fluorite.

Nevertheless, crystalline quartz has an anisotropic crystal structure and thereby exhibits strong birefringence. For this reason, crystalline quartz is applicable to an optical member not harmed by such birefringence or to an optical member configured to actively utilize the birefringence of crystalline quartz.

In these circumstances, it is proposed to use crystalline quartz as a part of illumination system optical components in a reduced projection exposure apparatus. Japanese Patent Application Laid-Open Gazette No. Hei 5(1993)-47636 discloses a technique to actively utilize the birefringence of crystalline quartz to fabricate a polarizing beam splitter or a depolarizer using crystalline quartz. The birefringence is essential to fabrication of these optical elements. Accordingly, fluorite or silica glass is not applicable thereto.

Meanwhile, Japanese Patent Application Laid-Open Gazette No. 2002-75835 discloses a technique to apply a diffractive optical element including a special process on a surface of a substrate thereof or a micro fly eye lens to a homogenizer for homogenizing a beam. It is extremely difficult to fabricate these optical elements by using fluorite because of the inadequate mechanical strength. Moreover, as the homogenizer is used in a position close to a light source, an energy density of an irradiated beam is relatively high.

Accordingly, there is a risk of formation of microchannels when the homogenizer is made of silica glass. For this reason, it is preferable to apply crystalline quartz, which is mechanically strong and capable of eliminating formation of microchannels, to these optical elements.

DISCLOSURE OF THE INVENTION

Nevertheless, conventional crystalline quartz exhibits satisfactory performances as materials for a visible light optical system but vary widely in terms of quality at the same time. Specifically, optical characteristics would be deteriorated easily upon repetitive irradiation of a short-wavelength and high-output beam such as an excimer laser for a long period of time in some conventional materials, or would not be deteriorated very much in some other conventional materials.

Therefore, the variation in the quality as well as the disadvantage of the strong birefringence constitute an obstacle to application of crystalline quartz to optical elements, which are subject to repetitive irradiation of a high-output beam having a short wavelength equal to or below 250 nm for a long period of time.

In view of the foregoing problem, it is an object of the present invention to provide a synthetic quartz member which is capable of sufficiently preventing formation of microchannels, having high mechanical strength, good workability into an optical element, and a transmittance characteristic which is hardly deteriorated by repetitive irradiation of a high-output beam having a short wavelength equal to or below 250 nm for a long period of time, and moreover, to provide an exposure apparatus applying the synthetic quartz member and a method of manufacturing the exposure apparatus.

The inventors of the present invention have probed the cause of deterioration in optical characteristics of synthetic quartz as a result of repetitive irradiation of a short-wavelength and high-output beam for a long period of time, and have found out that the deterioration in optical characteristics is attributable to adverse effects of certain impurities contained in the course of manufacturing processes including a method of forming synthetic quartz. In this way, the inventors have accomplished this invention.

Therefore, the present invention provides synthetic quartz members for solving the problem, exposure apparatuses using the synthetic quartz members, and methods of manufacturing the exposure apparatuses as described below.

Item 1: A synthetic quartz member used for an optical element subject to irradiation of a laser beam having a wavelength shorter than 250 nm, in which an absorption coefficient α for an infrared absorption band of a hydroxyl group located at 3585 cm$^{-1}$ is equal to or below 0.035/cm.

Item 2: The synthetic quartz member according to item 1, in which initial transmittance relative to light having a wavelength of 150 nm is equal to or above 60% per centimeter.

Item 3: The synthetic quartz member according to item 1, in which a content of aluminum is equal to or below 1 ppm and a content of lithium is equal to or below 0.5 ppm.

Item 4: The synthetic quartz member according to item 1, in which striae satisfy any of grade 1 and grade 2 as defined in Japan Optical Glass Industry Society Standard (JOGIS).

Item 5: A synthetic quartz member used for an optical element subject to irradiation of a laser beam having a wavelength shorter than 250 nm, in which initial transmittance relative to light having a wavelength of 150 nm is equal to or above 60% per centimeter.

Item 6: A synthetic quartz member used for an optical element subject to irradiation of a laser beam having a wavelength shorter than 250 nm, in which a content of aluminum is equal to or below 1 ppm, and a content of lithium is equal to or below 0.5 ppm.

Item 7: A synthetic quartz member used for an optical element subject to irradiation of a laser beam having a wavelength shorter than 250 nm, in which striae therein satisfy any of grade 1 and grade 2 as defined in Japan Optical Glass Industry Society Standard (JOGIS).

Item 8: A synthetic quartz member used for an optical element subject to irradiation of a laser beam having a wavelength shorter than 250 nm, in which initial transmittance relative to light having a wavelength of 150 nm is equal to or above 60% per centimeter, striae therein satisfy any of grade 1 and grade 2 as defined in Japan Optical Glass Industry Society Standard (JOGIS), an absorption coefficient α for an infrared absorption band of a hydroxyl group located at 3585 cm$^{-1}$ is equal to or below 0.035/cm, a content of aluminum is equal to or below 1 ppm, and a content of lithium is equal to or below 0.5 ppm.

Item 9: An exposure apparatus comprising: an illumination optical system configured to illuminate a mask by using a laser beam having a wavelength shorter than 250 nm as a light source; and a projection optical system configured to project and expose a pattern image of the mask onto an exposed substrate, in which an optical element made of the synthetic quartz member according to any one of items 1 to 8 is disposed at least in any one of the illumination optical system and the projection optical system.

Item 10: The exposure apparatus according to item 9, in which the optical element made of the synthetic quartz member is applied to an optical integrator in the illumination optical system.

Item 11: The exposure apparatus according to item 9, in which the optical element made of the synthetic quartz member is applied to at least any one of a phase shift component and a depolarizer in the illumination optical system.

Item 12: The exposure apparatus according to item 9, in which at least 80% of optical elements made of a synthetic quartz member and disposed in the exposure apparatus apply optical elements made of the synthetic quartz member according to any one of items 1 to 8.

Item 13: A method of manufacturing an exposure apparatus including an illumination optical system configured to illuminate a mask by using a laser beam having a wavelength shorter than 250 nm as a light source, and a projection optical system configured to project and expose a pattern image of the mask onto an exposed substrate, the method comprising the steps of: selecting and preparing an optical element made of the synthetic quartz member according to any one of items 1 to 8; preparing components other than the optical element made of the synthetic quartz member which are necessary for the exposure apparatus, and assembling the components necessary for the exposure apparatus together with the optical element made of the synthetic quartz member to obtain the exposure apparatus while disposing the optical element made of the synthetic quartz member at least in any one of the illumination optical system and the projection optical system.

Item 14: The method of manufacturing an exposure apparatus according to item 13, in which the optical element made of the synthetic quartz member is applied to an optical integrator in the illumination optical system.

Item 15: The method of manufacturing an exposure apparatus according to item 13, in which the optical element made of the synthetic quartz member is applied to at least any one of a phase shift component and a depolarizer in the illumination optical system.

Item 16: The method of manufacturing an exposure apparatus according to item 13, in which at least 80% of optical elements made of a synthetic quartz member and disposed in the exposure apparatus apply optical elements made of the synthetic quartz member according to any one of items 1 to 8.

According to the synthetic quartz member of any one of items 1 to 8 of the present invention, it is possible to sufficiently prevent formation of microchannels, to achieve high mechanical strength, and to process the synthetic quartz member easily into an optical element. In addition, by satisfying any of the conditions of initial transmittance relative to light having a wavelength of 150 nm being equal to or above 60% per centimeter, an absorption coefficient α for an infrared absorption band of a hydroxyl group located at 3585 cm$^{-1}$ being equal to or below 0.035/cm, and the content of aluminum being equal to or below 1 ppm while the content of lithium being equal to or below 0.5 ppm, it is possible to provide the synthetic quartz member having a transmittance characteristic which is hardly deteriorated by repetitive irradiation of a short-wavelength and high-output beam for a long period of time, and thereby to provide an excellent optical element by use of the synthetic quartz member.

Moreover, when striae therein satisfy any of grade 1 and grade 2 as defined in Japan Optical Glass Industry Society Standard, there are only a small number of striae which are apt to cause coloration after irradiation of an excimer laser. In this way, it is easier to prevent formation of a stria in the form of a layer.

Meanwhile, according to the exposure apparatus of any of items 9 to 12 of the present invention, the optical element made of the synthetic quartz member of the present invention is disposed in the illumination optical system and/or the projection optical system. Therefore, it is possible to suppress formation of microchannels in the optical element constituting the optical system and to suppress deterioration in a transmittance characteristic. In this way, it is possible to provide a highly durable exposure apparatus.

In addition, according to the method of manufacturing an exposure apparatus of any of items 13 to 16 of the present invention, it is possible to suppress formation of microchannels in the optical element constituting the optical system and to suppress deterioration in the transmittance characteristic at the same time. In this way, it is possible to obtain a highly durable exposure apparatus efficiently and reliably.

BEST MODE FOR CARRYING OUT THE INVENTION

Now, embodiments of the present invention will be described below.

Figure 1:
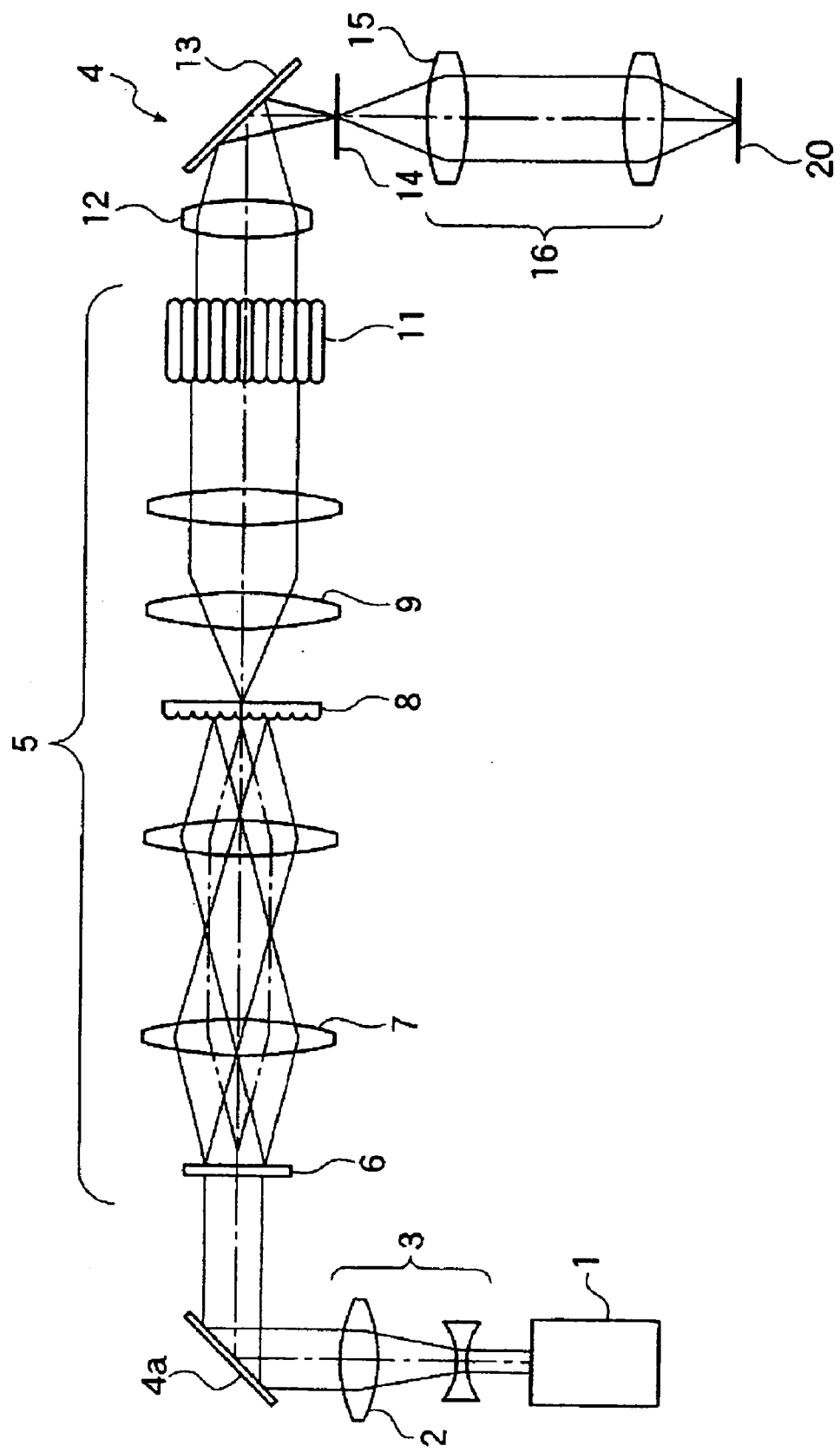
FIG. 1 is a view schematically showing a configuration of an exposure apparatus according to a preferred embodiment of the present invention.

FIG. 1 shows an exposure apparatus according to a preferred embodiment of the present invention, which is configured to emit ultraviolet rays having a wavelength equal to or below 250 nm such as a KrF excimer laser, an ArF excimer laser or a $F_2$ laser from a light source 1, to allow the ultraviolet rays to pass through an illumination optical system 4 and a projection optical system 16 including various optical elements, and thereby to transfer an exposure shape such as a circuit pattern of a mask 14 onto an exposure object 20 such as a wafer.

In this exposure apparatus, the ultraviolet rays emitted from the light source 1 are converted into a collimated beam by a beam shaping optical system 3 including a plurality of lenses 2 disposed therein. Thereafter, the collimated beam is deflected by a mirror 4a and is made incident on a homogenizer 5 of the illumination optical system 4.

In the homogenizer 5, the collimated beam is firstly made incident on a diffractive optical element 6 and is converted into a diverging beam having an annular cross section. The diverging beam is converted into an approximately collimated beam again by passing through a plurality of zoom lenses 7, and is then made incident on a micro fly eye lens 8. This micro fly eye lens 8 is an optical element including numerous micro lenses having regular hexagonal shapes which are densely arrayed lengthwise and crosswise. The micro fly eye lens 8 forms a ring-shaped light source on a focal plane on a rear side of each of the micro lenses based on the incident beam.

The beam outputted from the numerous light sources formed on the focal plane on the rear side of the micro fly eye lens 8 illuminate a fly eye lens 11 in an overlapping manner through a zoom lens 9. This fly eye lens 11 is formed by densely arraying numerous lens elements lengthwise and crosswise, and each of the lens elements has convex planes on an incident side and an outgoing side. Moreover, the fly eye lens 11 has a rectangular cross section similar to a shape of an illuminated field of a mask and to a shape of an exposed region formed on a wafer. Accordingly, a substantive surface light source in an annular shape is formed on a focal plane on a rear side of the fly eye lens 11.

Thereafter, deviation of the beam and other errors are corrected by the homogenizer 5, and the beam with reduced unevenness in ultraviolet-ray energy density is subjected to condensation by a condenser lens 12. Then, the beam passes through a mirror 13 and uniformly illuminates the mask 14 on which a given pattern is formed in an overlapping manner. Thereafter, the beam passes through the projection optical system 16 including multiple lenses 15, whereby the exposure shape such as the circuit pattern of a mask 14 is transferred onto the exposure object 20 such as the wafer.

In the present invention, a synthetic quartz member according to the present invention can be used as various optical elements in the above-described exposure apparatus. In particular, since the synthetic quartz member possesses strong birefringence, it is preferable to use an optical element made of the synthetic quartz member of the present invention as an optical element not harmed by the birefringence. It is more preferable to apply such an optical element to the illumination optical system and most preferable to apply the optical element to a phase shift component such as a polarizing beam splitter or a wavelength plate in the illumination optical system and/or a depolarizer. Meanwhile, it is also preferable to apply an optical element made of the synthetic quartz member of the present invention to an optical integrator in the illumination optical system.

Moreover, the number of components made of the synthetic quartz member used in one exposure apparatus generally ranges from about 2 to 10 pieces. Here, optical elements made of the synthetic quartz member of the present invention preferably account for at least 80% of all the components, and more preferably account for 100%.

To be more precise, the optical elements made of the synthetic quartz member of the present invention can be used as optical elements constituting the optical integrator such as the homogenizer 5 in the exposure apparatus. In terms of the exposure apparatus of this embodiment, the optical elements constituting this optical integrator includes diffractive optical elements such as the homogenizer 5, micro array lenses such as a micro fly eye lens 8 including the plurality of very small lens elements, the fly eye lens 11, and the like. The synthetic quartz member of the present invention is also applicable to rod-shaped optical elements of an internal reflection type such as a kaleidoscope, although such optical elements are not used in the exposure apparatus of this embodiment.

By using the synthetic quartz member of the present invention as the above-described optical elements, it is possible to prevent formation of microchannels without suppressing an output from the light source upon irradiation of a beam having a high energy density due to the crystalline nature of the synthetic quartz member. At the same time, the synthetic quartz member is not cleaved and is therefore mechanically strong. Accordingly, it is easy to process the synthetic quartz member into complicated shapes as represented by the micro fly eye lens 8, the fly eye lens 11, and the like.

The synthetic quartz member is manufactured by forming synthetic quartz in accordance with a hydrothermal synthesis method and then processing the synthetic quartz into a desired shape. The hydrothermal synthesis method means a method of obtaining the synthetic quartz by disposing quartz slug and an alkaline solution at a lower part and depositing a crystal in an autoclave adjusted to a high temperature and a high pressure while hanging a seed crystal at an upper part.

In the case of the synthetic quartz synthesized in accordance with the hydrothermal synthesis method, when variations in characteristics are measured by repetitively irradiating an ultraviolet laser such as a KrF or ArF excimer laser having a wavelength equal to or below 250 nm for a long period of time, colored samples and non-colored samples are generated after irradiation. In other words, the samples exhibiting substantial deterioration in transmittance and the samples exhibiting little deterioration in transmittance are generated.

As a result of measurement conducted by the inventors of the present invention, initial transmittance at 248 nm or 193 nm showed the same level in terms of both the colored sample and the non-colored sample. Therefore, it is not possible to screen the samples in terms of the quality of the characteristics on the basis of transmittance in a mainly used wavelength range.

However, as a result of reanalyzing the characteristics of the samples which did not exhibit deterioration in the previous experiment, the inventors have found out that it was possible to discriminate non-defective products from defective products on the basis of the initial transmittance at a wavelength around 150 nm, which was shorter than the wavelength of the ultraviolet laser actually used.

Therefore, in this embodiment, the synthetic quartz member of the present invention having favorable transmittance, which is hardly deteriorated upon irradiation of an ultraviolet laser having a wavelength equal to or below 250 nm, is obtained either by adjusting components in the alkaline solution for crystal growth and adjusting the pressure and the temperature during the crystal growth at the time of forming the synthetic quartz in accordance with the hydrothermal synthesis method, or by selecting the appropriate synthetic quartz member out of the synthetic quartz formed in accordance with the hydrothermal synthesis method, such that the initial transmittance of the synthetic quartz member relative to light having a wavelength of 150 nm becomes equal to or above 60%.

As described previously, there is no difference in the initial value by measuring the transmittance based on the wavelengths used by the KrF excimer laser, the ArF excimer laser, the $F_2$ laser and the like. However, the wavelength of 150 nm corresponds to a edge of the substantive absorption band of crystalline quartz. Accordingly, the initial transmittance measured by use of this wavelength strongly reflects crystallinity of the crystalline quartz. Moreover, the initial transmittance measured by this wavelength also reflects concentrations of impurities which are easily contained in the synthetic quartz according to the hydrothermal synthesis method and are apt to adversely affect durability of the transmittance. In other words, the synthetic quartz having the high transmittance at the wavelength of 150 nm represents high crystallinity and low impurity concentrations.

The ultraviolet rays having the wavelength of 150 nm cannot be used for judgment in the case of silica glass because the ultraviolet rays cannot pass therethrough. Meanwhile, fluorite possesses an absorption band which is shifted to a shorter wavelength side. Accordingly, the ultraviolet rays cannot be used for judgment in this case.

That is, information unique to crystalline quartz is included in the initial transmittance measured at the wavelength of 150 nm. Therefore, it is possible to obtain the synthetic quartz member of the present invention having the highly durable transmittance relative to the laser beam having the wavelength shorter than 250 nm by manufacturing the synthetic quartz member such that the initial transmittance at the wavelength of 150 nm becomes equal to or above 60%.

Here, the initial transmittance of the synthetic quartz member of the present invention is measured preferably at an interval approximately equal to or below 30 mm. If the member has a diameter equal to or below 30 mm, such measurement may be conducted at one point.

Next, as a result of reanalyzing the characteristics of the samples which exhibited deterioration in the previous experiment, the inventors have found out that impurities such as OH, Al or Li were contained in many of the defective products, and that there was a strong correlation between the contents of the impurities and generation of an induced optical absorption band.

For this reason, in this prevention, durability of the transmittance relative to the laser beam having the wavelength shorter than 250 nm is improved by firstly setting an absorption coefficient for an infrared absorption band of a hydroxyl group located at 3585 $cm^{-1}$ of the synthetic quartz member formed in accordance with the above-described hydrothermal synthesis method equal to or below 0.035/cm, either by adjusting the components in the alkaline solution for the crystal growth and adjusting the pressure and the temperature during the crystal growth at the time of forming the synthetic quartz in accordance with the hydrothermal synthesis method, or by selecting the appropriate synthetic quartz member out of the synthetic quartz formed in accordance with the hydrothermal synthesis method.

Since the hydrothermal synthesis method applies the alkaline solution, the content of the hydroxyl group in the obtained synthetic quartz tends to be increased in particular. In terms of the synthetic quartz member subject to irradiation of a laser beam having a wavelength shorter than 250 nm, induced absorption is increased along with an increase in the content of the hydroxyl group. Accordingly, it is easier to improve durability of the transmittance by reducing the induced absorption attributable to the hydroxyl group.

Particularly, in the case of the synthetic quartz member, the induced absorption is increased exponentially in a range where the absorption coefficient for the infrared absorption band of the hydroxyl group located at 3585 $cm^{-1}$ of the synthetic quartz member exceeds 0.035/cm. For this reason, in terms of the synthetic quartz member of the present invention, it is possible to improve durability of the transmittance relative to the above-mentioned short-wavelength laser beam by setting the absorption coefficient equal to or below 0.035/cm.

Here, the absorption coefficient of the synthetic quartz member of the present invention is measured preferably at an interval approximately equal to or below 30 mm. If the member has a diameter equal to or below 30 mm, such measurement may be conducted at one point.

Moreover, such synthetic quartz member also tends to contain aluminum and lithium easily. These impurities also have a large negative impact on durability of the transmittance of the synthetic quartz member relative to the laser beam having the wavelength shorter than 250 nm. For this reason, in the synthetic quartz member of the present invention, durability of the transmittance is improved by setting the content of aluminum equal to or below 1 ppm and the content of lithium equal to or below 0.5 ppm.

In addition, as a result of reanalyzing the characteristics of the samples obtained by the previous experiment, the inventors have found out that coloration induced on the defective products was distributed in the form of a layer in many cases.

This layer is relevant to occurrence of a certain obstacle in the course of the crystal growth. For example, impurities may be left in the layer or etch pits may be generated in the layer. Such a defect is frequently observed as a stria. Moreover, the inventors have found out that coloration was apt to occur along such a stria after irradiation of an excimer laser in the case of crystalline quartz having the stria.

Accordingly, in terms of the synthetic quartz member formed by the above-described hydrothermal synthesis method, striae preferably satisfy grade 1 or grade 2 as defined in Japan Optical Glass Industry Society Standard (JOGIS) in particular. In other words, it is satisfactory when no heterogeneity in the form of a layer is observed as a projected image using pin hole light in a space between two parallel surfaces each having dimensions of 50 mm×20 mm of an optical element having dimensions of 50 mm×50 mm×20 mm or when such a projected image is barely visible as a thin and dispersed stria. In the synthetic quartz member of the present invention having such striae, it is easy to suppress coloration generated along the portion of the striae in an irradiation range of the ultraviolet laser having the wavelength equal to or below 250 nm.

To obtain the synthetic quartz member having the stria which satisfies grade 1 or grade 2 as defined in Japan Optical Glass Industry Society Standard (JOGIS) more reliably, it is preferable to subject the synthetic quartz member to a pretreatment of removing an area including the seed crystal out of the synthetic quartz member formed by the hydrothermal synthesis method or the like.

Next, a method of manufacturing an exposure apparatus of the present invention will be described. The present invention provides a method of manufacturing an exposure apparatus having an illumination optical system configured to illuminate a mask by using a laser beam having a wavelength shorter than 250 nm as a light source, and a projection optical system configured to project and expose a pattern image of the mask onto an exposed substrate. Here, the method includes the steps of selecting and preparing an optical element made of the above-described synthetic quartz member of the present invention, preparing components other than the optical element made of the synthetic quartz member which are necessary for the exposure apparatus, and assembling the components necessary for the exposure apparatus together with the optical element made of the synthetic quartz member to obtain the exposure apparatus while disposing the optical element made of the synthetic quartz member at least in any one of the illumination optical system and the projection optical system.

Here, a concrete procedure for selecting the optical element made of the synthetic quartz member of the present invention is not particularly limited, and the procedure may be selected based at least on any one of the following standards:

(i) that the absorption coefficient α for the infrared absorption band of the hydroxyl group located at 3585 $cm^{-1}$ is equal to or below 0.035/cm;

(ii) that the initial transmittance relative to light having a wavelength of 150 nm is equal to or above 60% per centimeter;

(iii) that the content of aluminum is equal to or below 1 ppm and the content of lithium is equal to or below 0.5 ppm; and (iv) that the stria therein satisfies any of grade 1 and grade 2 as defined in Japan Optical Glass Industry Society Standard (JOGIS).

The components other than the optical element made of the synthetic quartz member which are necessary for the exposure apparatus are not particularly limited. Accordingly, it is possible to use various components generally used for an exposure apparatus as appropriate. Meanwhile, the method of assembling the components necessary for the exposure apparatus together with the optical element made of the synthetic quartz member is also not particularly limited. Accordingly, it is possible to apply a general method of assembling an exposure apparatus as appropriate.

It is to be noted that the present invention applicable not only to a scanning type projection exposure apparatus (U.S. Pat. No. 5,473,410) adopting a step-and-scan system or a so-called scanning stepper which is configured to expose a reticle pattern while synchronously moving a reticle and a wafer, but also to an exposure apparatus (a stepper) adopting a step-and-repeat system configured to expose a reticle pattern while stabilizing a reticle and a wafer and to move the wafer sequentially stepwise.

Meanwhile, the present invention is also applicable to a twin stage type exposure apparatus. Structures and exposure operations of twin stage type exposure apparatuses are disclosed in Japanese Patent Application Laid-Open Gazette No. Hei 10(1998)-163099 and No. Hei 10(1998)-214783 (corresponding to U.S. Pat. Nos. 6,341,007, 6,400,441, 6,549,269, and 6,590,634), International Application National-Phase Publication No. 2000-505958 (corresponding to U.S. Pat. No. 5,969,441), and U.S. Pat. No. 6,208,407, for example.

In addition, the present invention is also applicable to a liquid immersion exposure apparatus configured to fill a liquid locally in a space between a projection optical system and an exposure object, a liquid immersion exposure apparatus configured to move a stage which holds a substrate as an exposure object in a fluid tank, and a liquid immersion exposure apparatus configured to form a fluid tank with a given depth on a stage and to hold a substrate therein. A structure and an exposure operation of the liquid immersion exposure apparatus configured to move the stage which holds the substrate as the exposure object in the fluid tank are disclosed for instance in Japanese Patent Application Laid-Open Gazette No. Hei 6(1994)-124873, and the liquid immersion exposure apparatus configured to form the fluid tank with the given depth on the stage and to hold the substrate therein is disclosed for instance in Japanese Patent Application Laid-Open Gazette No. Hei 10(1998)-303114 and U.S. Pat. No. 5,825,043, respectively.

As described above, in the exposure apparatus of the present invention and the manufacturing method thereof according to the present invention, it is only necessary to select and dispose the optical element made of the synthetic quartz member of the present invention. Other features of the apparatus and the method are not particularly limited. The above-mentioned publications disclosing the configurations applicable to the exposure apparatus and the manufacturing method thereof according to the present invention, namely, U.S. Pat. Nos. 5,473,410, 6,341,007, 6,400,441, 6,549,269, 6,590,634, 5,969,441, 6,208,407, and 5,825,043, Japanese Patent Application Laid-Open Gazette Nos. Hei 10(1998)-163099, Hei 10(1998)-214783, Hei 6(1994)-124873, and Hei 10(1998)-303114, and International Application National-Phase Publication No. 2000-505958 are incorporated herein by reference.

EXAMPLES

Now, the present invention will be described more concretely based on examples and comparative examples. It is to be noted, however, that the present invention shall not be limited only to the following examples.

Example 1

Firstly, a block having dimensions of 60 mm (diameter)× 15 mm (thickness) was cut out of a region of a Z-plate crystalline quartz rough stone formed by the hydrothermal synthesis method after removing a seed crystal. A surface having the diameter of 60 mm was perpendicular to a Z axis. The disc having the thickness of 15 mm was ground and polished precisely, and a sample having a final shape having dimensions of 60 mm (diameter)×10 mm (thickness) was obtained.

Then, initial transmittance relative to light having a wavelength of 150 nm (%/cm, /cm is a unit thickness), and an amount of induced absorption (/cm) after irradiation of an ArF excimer laser at 200 mJ/cm$^2$ for $1 \times 10^6$ pulses were measured by use of the obtained synthetic quartz sample.

Irradiation of ultraviolet rays having the wavelength of 150 nm onto the sample was executed in an aluminum chamber purged with nitrogen. The surface having the diameter of 60 mm was placed upright, and the light was irradiated from a perpendicular direction to the surface having the diameter of 60 mm.

Meanwhile, a commercially available single-beam spectrophotometer was used for measurement of optical transmittance in a vacuum ultraviolet region. A deuterium lamp was used as a light source, and light split into a spectrum by the diffractive optical element was introduced to a sample chamber evacuated with a turbomolecular pump. Intensity of the light passing through the sample chamber was detected with a photomultiplier, and a spectrum was recorded in a computer. First of all, a blank spectrum was measured without placing anything on a sample stage. Then, the synthetic quartz sample having the dimensions of 60 mm (diameter)×10 mm (thickness) was left at rest on the sample stage, and the intensity of the light passing through the sample was measured. An intensity ratio between the blank and the light passing through the sample was defined as transmittance of the sample.

Figure 2:
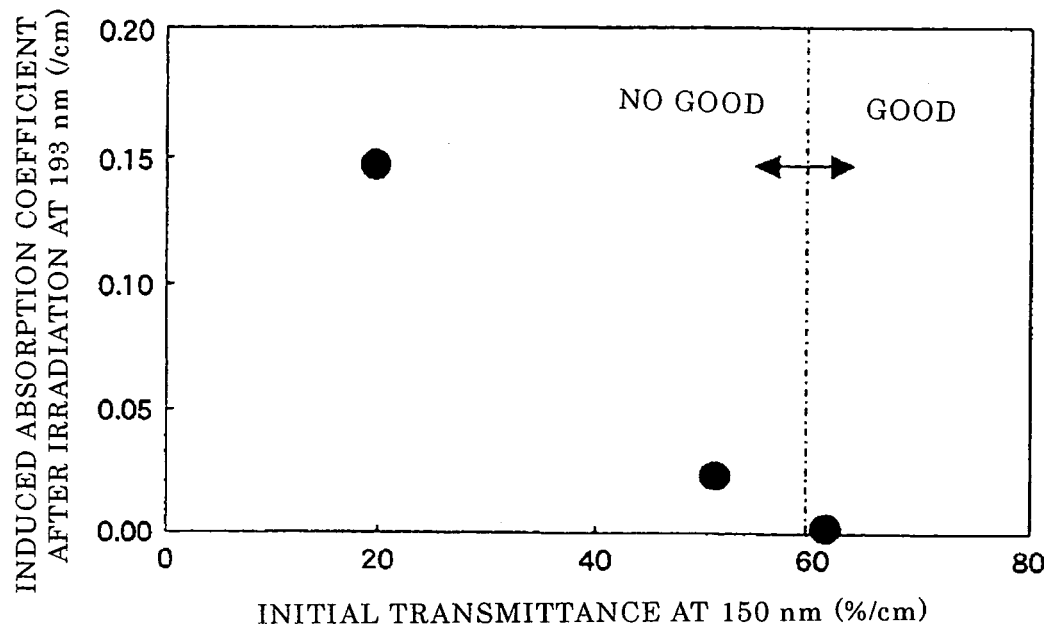
FIG. 2 is a graph showing a relation between initial transmittance relative to light having a wavelength of 150 nm and an amount of induced absorption at a wavelength of 193 nm after irradiation of an ArF excimer laser.

FIG. 2 shows a relation between the initial transmittance at the wavelength of 150 nm (%/cm), and the amount of induced absorption (/cm) at a wavelength of 193 nm after irradiation of the ArF excimer laser. In the graph, a lateral axis indicates the initial transmittance at the wavelength of 150 nm measured by use of the sample having the thickness of 1 cm, while the longitudinal axis indicates an induced absorption coefficient (/cm) induced at the wavelength of 193 nm after irradiation of the ArF excimer laser.

Here, the amount of induced absorption means a difference between the absorption coefficients (/cm) before and after irradiation. It is apparent from the graph that the amount of induced absorption (/cm) at the wavelength of 193 nm exponentially increases when the initial transmittance at the wavelength of 150 nm is below 60%.

Based on the graph of FIG. 2, the synthetic quartz samples were screened by use of the initial transmittance at the wavelength of 150 nm as an index. The transmittance at the wavelength of 193 nm was hardly reduced in terms of the samples having the initial transmittance higher than 60% after irradiation of the ArF excimer laser, whereas the transmittance at the wavelength of 193 nm was reduced in terms of all the samples having the initial transmittance lower than 60% after irradiation of the ArF excimer laser. Moreover, the sample having the lower initial transmittance at the wavelength of 150 nm exhibited more significant reduction in the transmittance at the wavelength of 193 nm after irradiation of the laser.

Accordingly, it is possible to discriminate and use a nondefective product from a defective product by investigating whether or not the sample has the initial transmittance equal to or above 60%.

Example 2

A relation between a position of a stria and a position of a colored portion was observed by use of the sample fabricated in accordance with the foregoing example.

Evaluation of the degree of the stria was carried out by visually observing a projected image using pin hole light. Incandescent light was converted into uniform monochromatic light (yellow) by use of a filter and a diffuser. A beam collimated by use of a pin hole having a diameter of 0.5 mm and a collimation lens was irradiated on the sample. The light passing through the sample was projected on a screen made of a while flat plate. Then, intensity of the stria was compared between a test article and a standard sample, and the degree of the stria was thereby determined.

Thereafter, the ArF excimer laser was irradiated on the sample including a stria equivalent to grade 2 at 200 mJ/cm² for 1×10⁶ pulses. The laser beam was allowed to pass through an aperture having dimensions of 10 mm×10 mm and was irradiated in the center of the sample. A portion of the stria located in the irradiated region was particularly colored. Coloration was visible enough to the naked eye and looked like dark gray smoke.

Figure 3A:
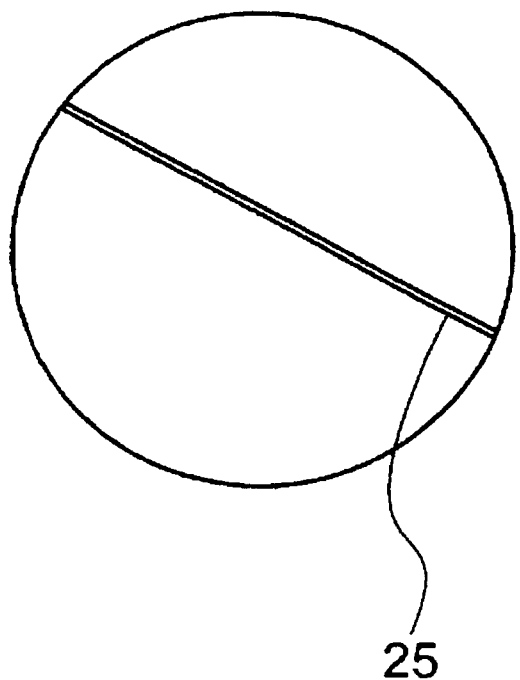
FIG. 3A is a schematic diagram showing a position of a stria and a position of coloration before irradiation of an ArF excimer laser.
Figure 3B:
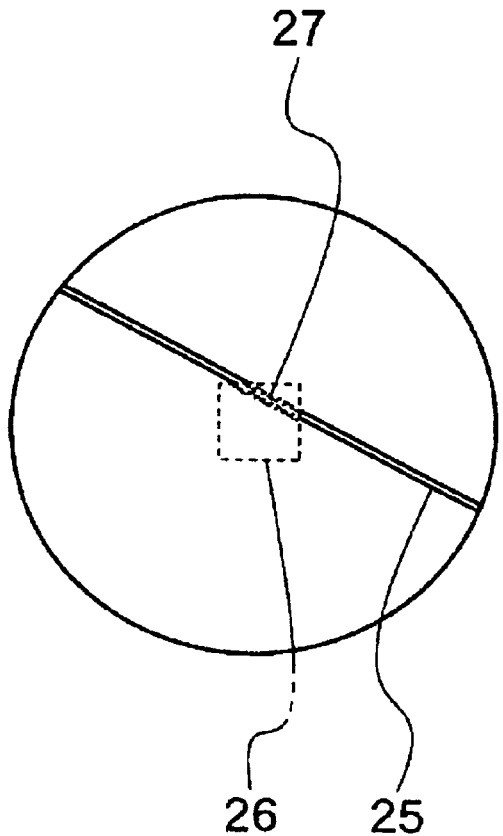
FIG. 3B is a schematic diagram showing the position of the stria and the position of coloration after irradiation of the ArF excimer laser.

FIG. 3A and FIG. 3B show a relation between the stria and the position of coloration after irradiation of the laser. Here, the surface having the diameter of 60 mm is viewed from immediately above. FIG. 3A shows the surface before irradiation of the laser, and FIG. 3B shows the surface after irradiation of the laser. After irradiation of the laser, coloration 27 like the dark gray smoke was observed in an irradiated region 26 so as to extend along a stria 25 identified by projection of the pin hole light before irradiation of the laser.

Therefore, coloration tends to be generated along the stria when there is a stria. Accordingly, it is desirable to reduce the stria as small as possible such that the stria satisfies grade 1 or grade 2 as defined by the JOGIS standard.

Example 3

A level (/cm) of an infrared absorption band of OH and an amount of induced absorption (/cm) at a wavelength of 193 nm after irradiation of an ArF excimer laser at 200 mJ/cm² for 1×10⁶ pulses were measured by use of the synthetic quartz member (60 mm (diameter)×10 mm (thickness)) fabricated in accordance with the foregoing example.

A commercially available double-beam spectrophotometer was used for measurement of optical transmittance from a near-infrared region to an ultraviolet region. A halogen lamp was used as a light source in the near-infrared region while a deuterium lamp was used as a light source in the ultraviolet region, and light split into a spectrum by the diffractive optical element was divided into two light beams of a reference light beam and a measurement light beam. Both of the split light beams were introduced to a sample chamber purged with nitrogen gas. Nothing was placed on a sample stage on the reference light beam's side. Meanwhile, the synthetic quartz sample having the dimensions of 60 mm (diameter)×10 mm (thickness) was left at rest on a sample stage on the measurement light beam's side. The reference light beam and the measurement light beam passing through the sample chamber were condensed by an integrating sphere and were detected by a photomultiplier. A proportion between intensity of the reference light beam and intensity of the measurement light beam was defined as the transmittance.

Figure 4:
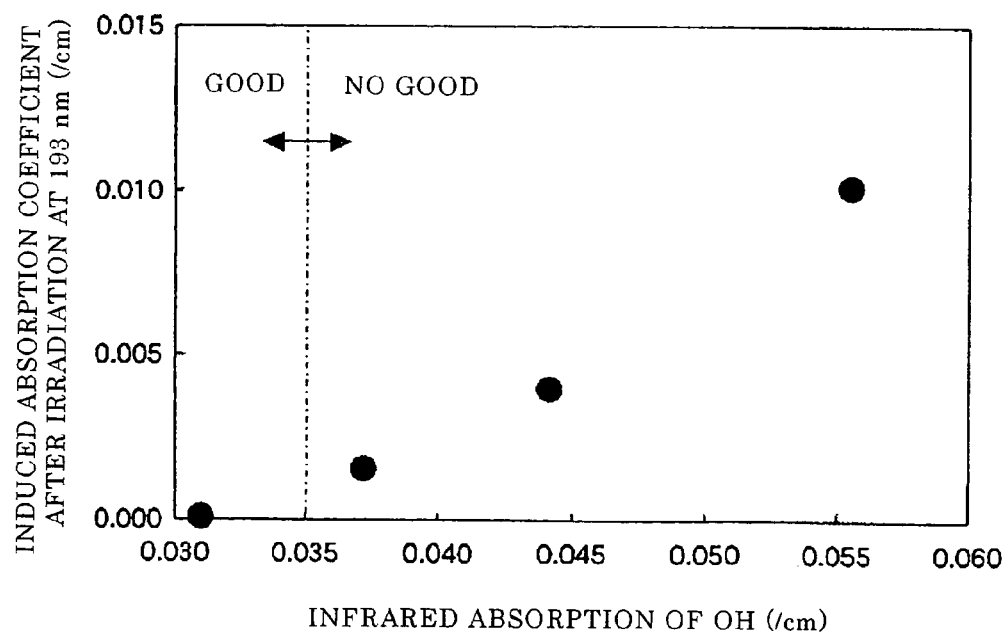
FIG. 4 is a graph showing a relation between the amount of induced absorption at the wavelength of 193 nm after irradiation of the ArF excimer laser and a level of an infrared absorption band located at 3585 cm$^{-1}$.

FIG. 4 shows a relation between the level (/cm) of the infrared absorption band of OH and the amount of induced absorption (/cm) at the wavelength of 193 nm after irradiation of the ArF excimer laser.

Here, the level of the infrared absorption band of OH is equal to a value obtained by subtracting an absorption coefficient in a position at a wavelength of 2700 nm as a base from an absorption coefficient in a position at a wavelength of 2789 nm (a wavenumber of 3585 cm⁻¹). Meanwhile, the amount of induced absorption means a difference between the absorption coefficients (/cm) before and after irradiation.

FIG. 4 shows the relation between the amount of induced absorption at the wavelength of 193 nm after irradiation of the ArF excimer laser and the level of the infrared absorption band located at 3585 cm⁻¹. It is apparent from the graph that the amount of induced absorption after irradiation exponentially increases when the level of the infrared absorption band of OH exceeds 0.035/cm⁻¹.

Viewing FIG. 4, it is apparent that the amount of induced absorption (/cm) at the wavelength of 193 nm exponentially increases when the level of the absorption band of OH exceeds 0.035/cm⁻¹. Based on this graph, the synthetic quartz samples were screened by use of the level of the absorption band of OH as an index. The transmittance at the wavelength of 193 nm was hardly reduced in terms of the crystalline quartz located at the level of the absorption band of OH lower than 0.035/cm⁻¹ after irradiation of the ArF excimer laser, whereas the transmittance at the wavelength of 193 nm was significantly reduced in terms of the crystalline quartz located at the level of the absorption band of OH higher than 0.035/cm⁻¹ after irradiation of the ArF excimer laser. Moreover, the sample having the higher level of the absorption band of OH exhibited more significant reduction in the transmittance at the wavelength of 193 nm after irradiation of the laser.

Example 4

An ArF excimer laser was irradiated on the synthetic quartz member (60 mm (diameter)×10 mm (thickness)) fabricated in accordance with the foregoing example at 200 mJ/cm² for 1×10⁶ pulses. Then, the amount of induced absorption (/cm) at the wavelength of 193 nm after irradiation of the ArF excimer laser was measured and the contents of impurities such as aluminum or lithium contained in the sample were quantitatively evaluated by use of an inductively coupled plasma (ICP) mass spectrometer.

Figure 5:
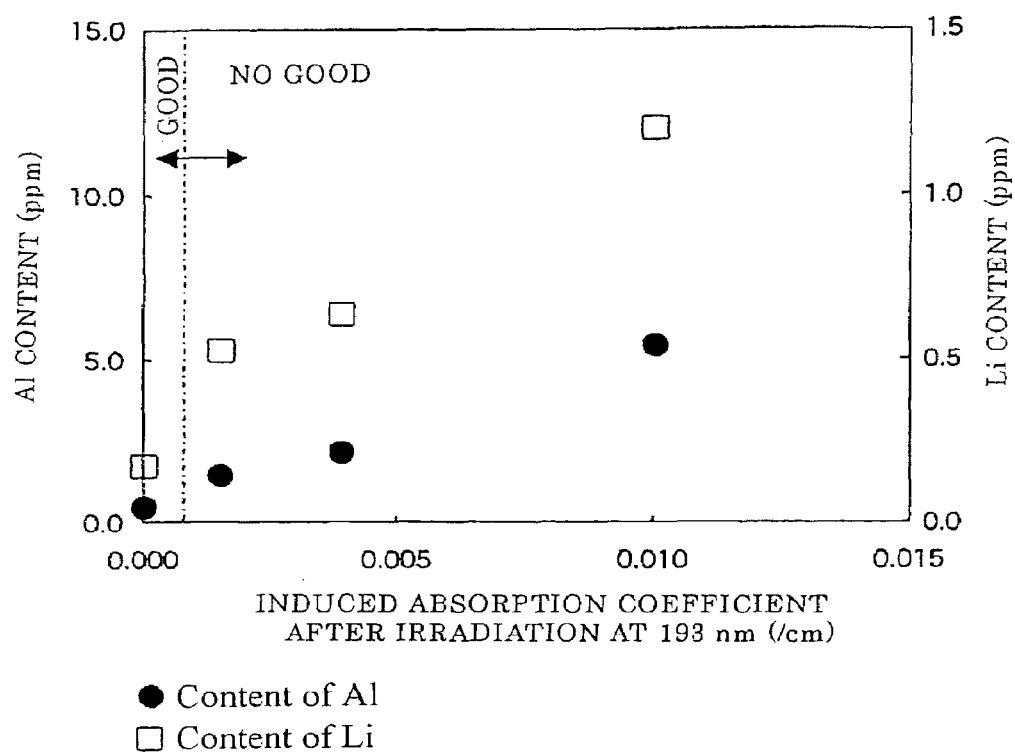
FIG. 5 is a graph showing a relation between the amount of induced absorption at the wavelength of 193 nm after irradiation of the ArF excimer laser and amounts of impurities including Al and Li.

FIG. 5 shows a relation between the amount of induced absorption (/cm) at the wavelength of 193 nm after irradiation of the ArF excimer laser and the contents (ppm) of Al and Li impurities. Here, the amount of induced absorption means the difference between the absorption coefficients (/cm) before and after irradiation.

FIG. 5 shows the relation between the amount of induced absorption at the wavelength of 193 nm after irradiation of the ArF excimer laser and the contents of the Al and Li impurities. The longitudinal axis on the left indicates the content (ppm) of Al, while the longitudinal axis on the right indicates the content (ppm) of Li. Black circles (●) represent data for the content of Al and white squares (□) represent data for the content of Li. The amount of induced absorption at the wavelength of 193 nm after irradiation is increased almost in a linear fashion relative to the content of Al and to the content of Li.

Viewing FIG. 5, it is apparent that the amount of induced absorption (/cm) at the wavelength of 193 nm increases in a linear fashion when the content of Al exceeds 1 ppm. Based on this graph, the synthetic quartz samples were screened by use of the content of Al as an index. The transmittance at the wavelength of 193 nm was hardly reduced in terms of the crystalline quartz having the content of Al less than 1 ppm after irradiation of the ArF excimer laser, whereas the transmittance at the wavelength of 193 nm was significantly reduced in terms of the crystalline quartz having the content of Al more than 1 ppm after irradiation of the ArF excimer laser. Moreover, the sample having the higher content of Al exhibited more significant reduction in the transmittance at the wavelength of 193 nm after irradiation of the laser.

Similarly, it is apparent that the amount of induced absorption (/cm) at the wavelength of 193 nm increases in a linear fashion when the content of Li exceeds 0.5 ppm. Based on this graph, the synthetic quartz samples were screened by use of the content of Li as an index. The transmittance at the wavelength of 193 nm was hardly reduced in terms of the crystalline quartz having the content of Li less than 0.5 ppm after irradiation of the ArF excimer laser, whereas the transmittance at the wavelength of 193 nm was significantly reduced in terms of the crystalline quartz having the content of Li more than 0.5 ppm after irradiation of the ArF excimer laser. Moreover, the sample having the higher content of Li exhibited more significant reduction in the transmittance at the wavelength of 193 nm after irradiation of the laser.

Example 5

Figure 6:
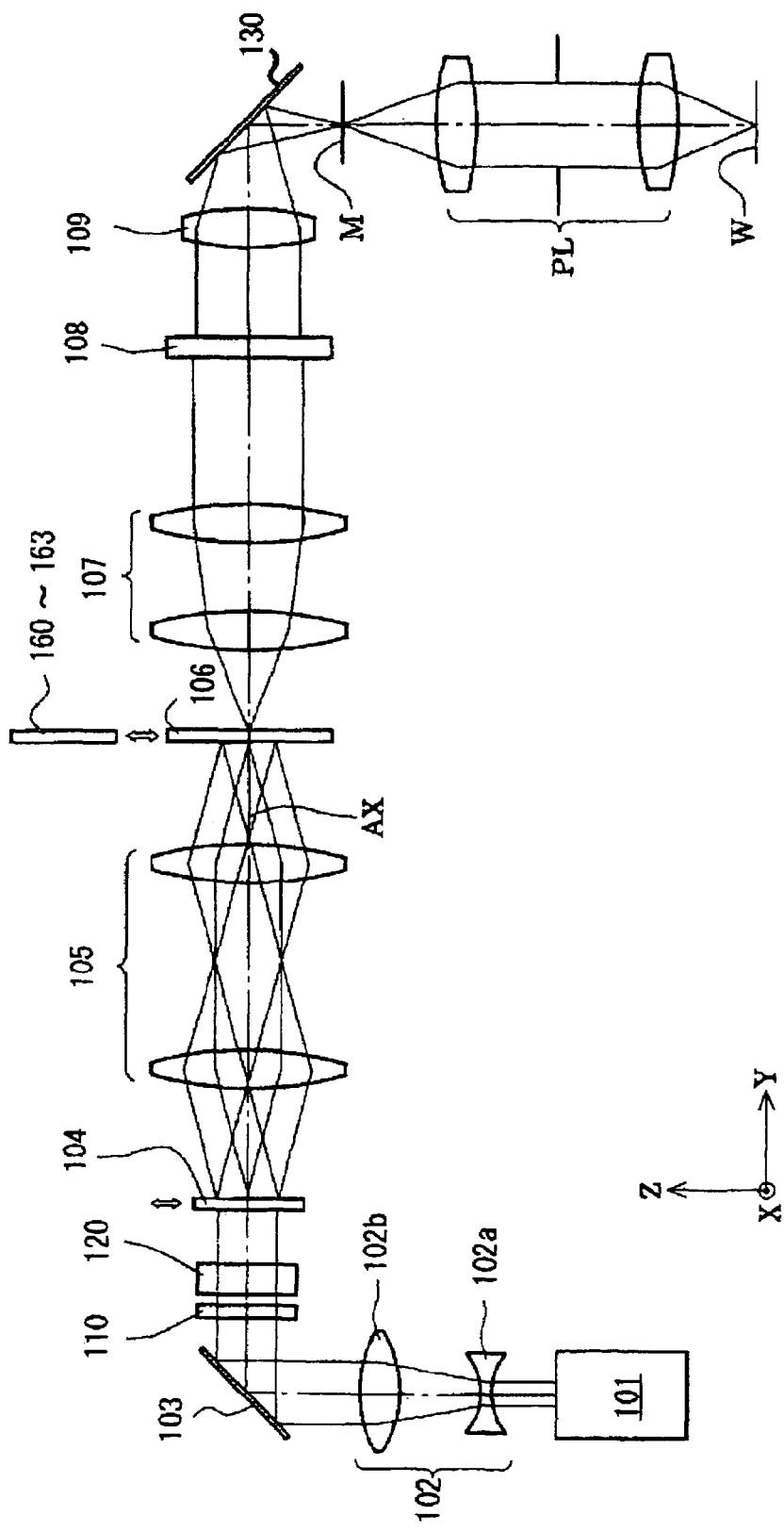
FIG. 6 is a view schematically showing an exposure apparatus according to another preferred embodiment of the present invention.

An exposure apparatus having a configuration shown in FIG. 6 was manufactured in this example.

First, a single crystal synthetic quartz member was manufactured in accordance with the hydrothermal synthesis method. Since the synthesized single crystal ingot contained the seed crystal, the ingot was observed by the naked eye using a condenser lamp to find a boundary with the seed crystal. The boundary was marked and the portion of the seed crystal was cut out and removed while leaving a margin of 5 mm outside such marking. In this way, the single crystal after removing the portion of the seed crystal was used as a base material for manufacturing an optical element.

A columnar sample having a diameter of 30 mm was cut out of the base material, and two surfaces thereof were optically polished in parallel. In this way, a sample having a thickness of 10 mm was formed for the purpose of measurement of the transmittance. The initial transmittance of this sample relative to the light having the wavelength of 150 nm was measured by use of the commercially available single-beam vacuum ultraviolet spectrophotometer.

Next, using the sample for measurement of the transmittance, the absorption coefficient located at 3585 cm$^{-1}$ (=2789 nm) was measured with a commercially available double-beam infrared spectrophotometer. To be more precise, measurement of the transmittance was performed in the form of a wavelength sweep from 2600 nm to 3200 nm, and a transmittance spectrum thus measured was converted into an absorption spectrum. An absorption coefficient located at 3703 cm$^{-1}$ (=2700 nm) in this absorption spectrum was defined as a base line and then the absorption coefficient located at 3585 cm$^{-1}$ was obtained.

Next, a crystal having dimensions of 50 mm×50 mm×20 mm was cut out of the base material, and two surfaces each having dimensions of 50 mm×20 mm were optically polished in parallel, thereby forming a sample for stria evaluation. This sample was compared with a standard sample in accordance with JOGIS (Japan Optical Glass Industry Society) 11-1975 to determine a grade of the stria.

Next, part of the base material was collected for a chemical analysis, and the contents of aluminum and lithium were quantitatively analyzed by use of the ICP mass spectrometer.

Based on results of evaluation of the above-described items, the base material satisfying all the following conditions was selected, namely, the initial transmittance relative to the light having the wavelength of 150 nm being equal to or above 60%, the absorption coefficient located at 3585 cm$^{-1}$ being equal to or below 0.035/cm, the grade of the stria satisfying grade 1 or grade 2, the content of aluminum being equal to or below 1 ppm, and the content of lithium being equal to or below 0.5 ppm.

A desired size of the synthetic quartz single crystal was cut out of the selected base material and was subjected to normal grinding and polishing processes. In this way, a half-wavelength plate having a given thickness and a prism having a given apex angle were formed. Meanwhile, the synthetic quartz single crystal was cut into a plate and a given resist pattern was formed on a surface thereof by use of photolithography. Then, the plate was formed into a diffractive optical element having a given surface shape which was processed by dry etching. The half-wavelength plate, the prism, and the diffractive optical element which were made of the synthetic quartz single crystal were assembled with other optical members made of synthetic silica glass or calcium fluoride. In this way, the exposure apparatus shown in FIG. 6 was manufactured.

In FIG. 6, a Z axis is defined in a direction of a normal line of a wafer W which is a photosensitive substrate. Meanwhile, a Y axis is defined in a direction parallel to the sheet surface of FIG. 6, and an X axis is defined in a perpendicular direction to the sheet surface of FIG. 6, respectively, on a surface of the wafer. In FIG. 6, an illumination optical device is configured to perform annular illumination.

The exposure apparatus shown in FIG. 6 includes an ArF excimer laser light source 101 having a wave length of 193 nm for supplying exposure light (illumination light). An approximately collimated beam emitted from the laser light source 101 along the Z direction has a rectangular cross section longitudinally extending in the X direction. The beam is made incident on a beam expander 102 which includes a pair of lenses 102a and 102b. The lenses 102a and 102b negative refracting power and positive refracting power on the sheet surface of FIG. 6 (on a YZ plane), respectively. Therefore, the beam incident on the beam expander 102 is expanded on the sheet surface of FIG. 6, and is thereby shaped into the beam having a predetermined rectangular cross section.

The approximately collimated beam passing through the beam expander 102 as a shaping optical system is then deflected in the Y direction by a deflection mirror 103. Thereafter, the beam passes through a phase shift member 110, a depolarizer (an unpolarizing element) 120, and a diffractive optical element 104, and is then made incident on afocal zoom lenses 105. The diffractive optical element 104 is constructed by forming steps having a pitch comparable to the wavelength of exposure light (illumination light) on a base plate made of the synthetic quartz single crystal. The beam passing through the diffractive optical element 104 forms circular light intensity distribution in positions of pupils of the afocal zoom lenses 105, i.e. a beam having a circular cross section. The diffractive optical element 104 is rendered retractable from an illumination light path.

The afocal zoom lenses 105 are configured to be capable of changing the magnification continuously within a predetermined range while maintaining an afocal system (an afocal optical system). The beam passing through the afocal zoom lenses 105 is made incident on a diffractive optical element 106 for annular illumination. The afocal zoom lenses 105 connect the origin of divergence of the diffractive optical element 104 to a diffractive surface of the diffractive optical element 106 nearly in an optically conjugated fashion. Moreover, the numerical aperture of the beam focused on one point either on the diffractive surface of the diffractive optical element 106 or on a surface in the vicinity thereof changes depending on the magnifications of the afocal lenses 105.

Upon incidence of a collimated beam, the diffractive optical element 106 for annular illumination has a function to form light intensity distribution of a ring shape in a far field thereof. The diffractive optical element 106 is rendered retractable from an illumination light path and replaceable with a diffractive optical element 160 for quadrupole illumination, a diffractive optical element 161 for circular illumination, a diffractive optical element 162 for bipolar illumination in the X direction, and a diffractive optical element 163 for bipolar illumination in the Y direction.

The beam passing through the diffractive optical element 106 is made incident on zoom lenses 107. An incident surface of a micro lens array (or a fly eye lens) 108 is positioned in the vicinity of a focal surface on a rear side of the zoom lenses 107. The micro lens array 108 is an optical element including numerous micro lenses having positive refracting power, which are densely arrayed lengthwise and crosswise. In general, the micro lens array is constructed by forming a group of micro lenses by etching a parallel flat plate, for example.

The beam from the circular light intensity distribution formed in the positions of pupils of the afocal zoom lenses 105 through the diffractive optical element 104 is emitted from the afocal zoom lenses 105 and is made incident on the diffractive optical element 106 as the beam containing various angular components. In other words, the diffractive optical element 104 constitutes an optical integrator having a function to form an angled beam. Meanwhile, the diffractive optical element 106 has a function as a beam conversion element for forming the ring-shaped light intensity distribution in the far field upon incidence of the collimated beam. Therefore, the beam passing through the diffractive optical element 106 forms the annularly illuminated field around an optical axis AX, for example, on the focal surface on the rear side of the zoom lenses 107 (and eventually on the incident surface of the micro lens array 108).

The beam incident on the micro lens array 108 is split two-dimensionally, and numerous light sources (hereinafter referred to as "secondary light sources") in an annular shape similar to the illuminated field formed by the incident beam are formed on a focal surface on a rear side of the micro lens array 108.

The beam from the annular secondary light sources formed on the focal surface on the rear side of the micro lens array 108 is subjected to a condensing operation by a condenser optical system 109. Thereafter, the beam passes through a mirror 130 and illuminates a mask M in an overlapping fashion. Here, a given pattern is formed on the mask M. The beam passing through the pattern on the mask M forms an image of the mask pattern on a wafer W being a photosensitive substrate through a projection optical system PL. In this way, the pattern on the mask M is sequentially exposed on each exposure region of the wafer W by performing either one-shot exposure or scanning exposure while two-dimensionally controlling drive of the waver W within a plane (an XY plane) orthogonal to the optical axis AX of the projection optical system PL.

Figure 7:
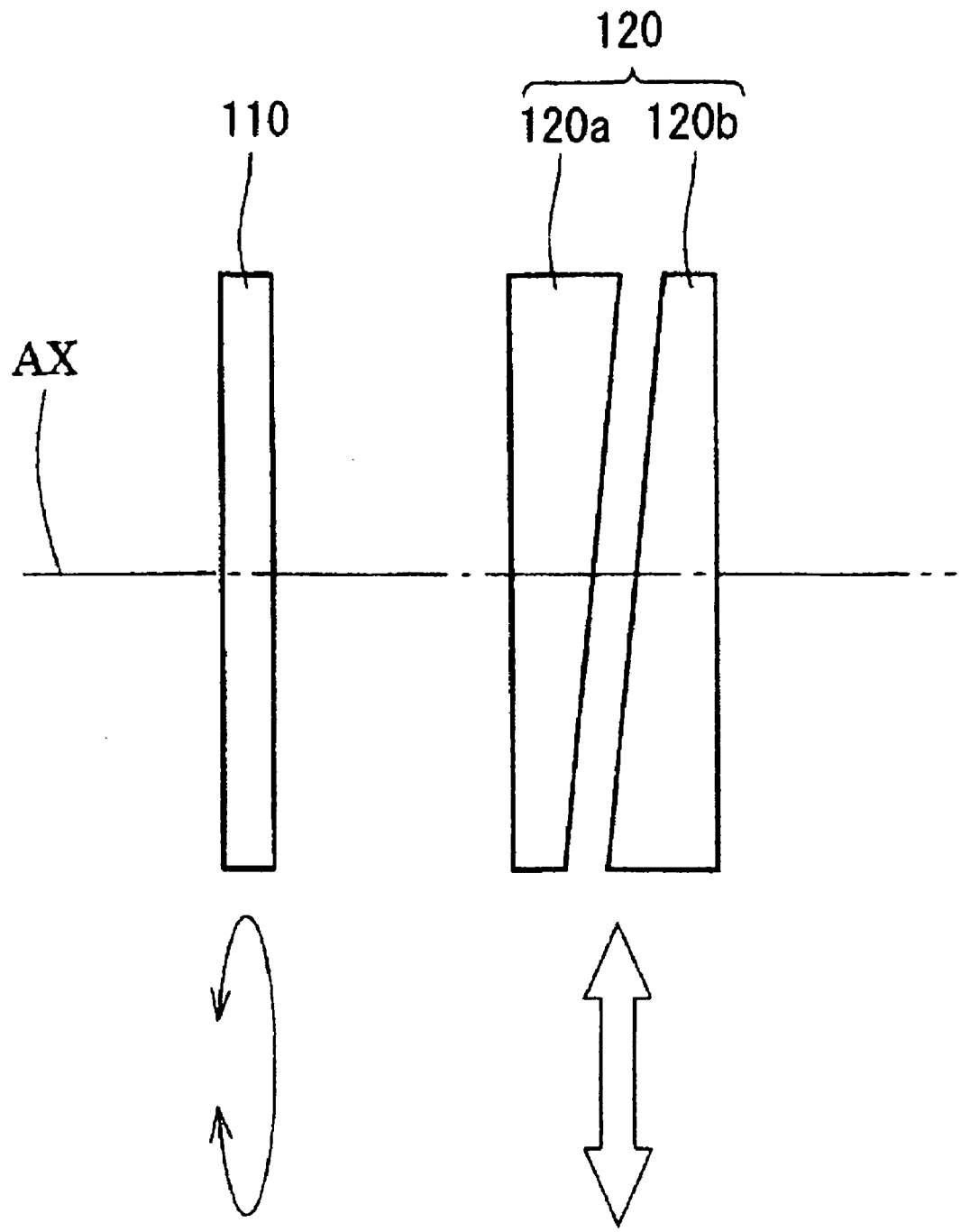
FIG. 7 is a view schematically showing configurations of a phase shift component and a depolarizer shown in FIG. 6.

FIG. 7 is a view schematically showing configurations of the phase shift member 110 and the depolarizer 120 shown in FIG. 6.

The phase shift member 110 includes a half-wavelength plate which is made of a crystalline quartz single crystal configured to render a crystalline optical axis rotatable around the optical axis AX. In the meantime, the depolarizer 120 includes a crystalline quartz single crystal prism 120a in a wedge shape and a silica glass prism 120b in a wedge shape which is complementary to this crystalline quartz single crystal prism 120a. The crystalline quartz single crystal prism 120a and the silica glass prism 120b are formed into an integrated prism assembly, which is retractable from the illumination light path. A degree of polarization of the light emitted from the laser light source 101 is typically equal to or above 95%. Accordingly, the substantially linearly-polarized light is made incident on the half-wavelength plate 110.

When the crystalline optical axis of the half-wavelength plate 110 is set to form an angle of 0 degrees or 90 degrees relative to a plane of polarization of the incident linearly-polarized light, the linearly-polarized light incident on the half-wavelength plate 110 simply passes through the half-wavelength plate without changing the plane of polarization. Meanwhile, when the crystalline optical axis of the half-wavelength plate 110 is set to form an angle of 45 degrees relative to the plane of polarization of the incident linearly-polarized light, the linearly-polarized light incident on the half-wavelength plate 110 is converted into linearly-polarized light in which a plane of polarization is changed by 90 degrees. Moreover, when a crystalline optical axis of the crystalline quartz single crystal prism 120a is set to form an angle of 45 degrees relative to the plane of polarization of the incident linearly-polarized light, the linearly-polarized light incident on the crystalline quartz single crystal prism 120a is converted into light in an unpolarized state (unpolarized).

The light unpolarized by the crystalline quartz single crystal prism 120a passes through the silica glass prism 120b functioning as a compensator for compensating a traveling direction of the light, and then illuminates the mask M (and eventually the wafer W) in the unpolarized state. In the meantime, when the crystalline optical axis of the half-wavelength plate 110 is set to form an angle of 45 degrees relative to a plane of polarization of incident p-polarized light, the plane of polarization of the p-polarized light incident on the half-wavelength plate 110 is changed by 90 degrees, and the p-polarized light is therefore converted into s-polarized light and is made incident on the crystalline quartz single crystal prism 120a. Here, the crystalline optical axis of the crystalline quartz single crystal prism 120a is also set to form an angle of 45 degrees relative to a plane of polarization of the incident s-polarized light. Accordingly, the s-polarized light incident on the crystalline quartz single crystal prism 120a is converted into light in the unpolarized state, and illuminates the mask M through the silica glass prism 120b in the unpolarized state.

On the other hand, in the case where the depolarizer 120 is retracted from the illumination light path, when the crystalline optical axis of the half-wavelength plate 110 is set to form an angle of 0 degrees or 90 degrees relative to the plane of polarization of the incident p-polarized light, the p-polarized light incident on the half-wavelength plate 110 simply passes through the half-wavelength plate without changing the plane of polarization, and illuminates the mask M in the p-polarized state. Meanwhile, when the crystalline optical axis of the half-wavelength plate 110 is set to form an angle of 45 degrees relative to the plane of polarization of the incident p-polarized light, the p-polarized light incident on the half-wavelength plate 110 is converted into s-polarized light in which a plane of polarization is changed by 90 degrees, and illuminates the mask M in the s-polarized state.

As described above, in the exposure apparatus shown in FIG. 6 it is possible to illuminate the mask M in the unpolarized state by inserting and positioning the depolarizer 120 into the illumination light path. Moreover, it is possible to illuminate the mask M in the p-polarized state by retracting the depolarizer 120 from the illumination light path and setting the crystalline optical axis of the half-wavelength plate 110 to form the angle of 0 degrees or 90 degrees relative to the plane of polarization of the incident p-polarized light. In addition, it is possible to illuminate the mask M in the s-polarized state by retracting the depolarizer 120 from the illumination light path and setting the crystalline optical axis of the half-wavelength plate 110 to form the angle of 45 degrees relative to the plane of polarization of the incident p-polarized light.

The exposure apparatus manufactured by selecting the base material of the synthetic quartz single crystal according to the example was compared as described below with an exposure apparatus having the same configuration as the above-mentioned exposure apparatus, which was nevertheless manufactured without selecting the base material of the synthetic quartz single crystal. Specifically, the both apparatuses were continuously operated under the same exposure conditions. Thereafter, variations in illuminance on surfaces of wafers were measured.

In the case of the exposure apparatus manufactured in accordance with the method of manufacturing an exposure apparatus of the present invention by applying the selected synthetic quartz single crystal satisfying the conditions of selection according to the present invention, no variation was observed on the wafer before performing exposure for $1\times10^{10}$ shots. On the other hand, in the case of the conventional exposure apparatus manufactured by applying the synthetic quartz member without performing selection, the illuminance on the wafer suddenly dropped when the number of shots accounted approximately for $1\times10^9$ shots and above. Specifically, at the point after performing exposure for $5\times10^9$ shots, the illuminance on the wafer was reduced to 65% of the initial value.

Here, in the case of the synthetic quartz single crystal not satisfying the conditions of selection according to the present invention, deterioration in the transmittance accounts for about 10% in each piece. This example applies the four relevant optical elements, namely, the wavelength plate, the two prisms, and the diffractive optical elements. Therefore, reduction in the illuminance accounts for 0.65, which is almost equivalent to (0.9) to the fourth-power.

INDUSTRIAL APPLICABILITY

As described above in detail, according to the present invention, it is possible to provide a synthetic quartz member which is capable of sufficiently preventing formation of microchannels, having high mechanical strength, good workability into an optical element, and a transmittance characteristic which is hardly deteriorated even by repetitive irradiation of a high-output beam having a short wavelength equal to or below 250 nm for a long period of time, and moreover, to provide an exposure apparatus applying the synthetic quartz member and a method of manufacturing the exposure apparatus.

The invention claimed is:

1. A synthetic quartz optical element subject to irradiation of a laser beam having a wavelength shorter than 250 nm,
  wherein an absorption coefficient $\alpha$ for an infrared absorption band of a hydroxyl group located at 3585 cm$^{-1}$ is equal to or below 0.035/cm, and
  initial transmittance relative to light having a wavelength of 150 nm is equal to or above 60% per centimeter.

2. The synthetic quartz optical element according to claim 1,
  wherein a content of aluminum is equal to or below 1 ppm, and
  a content of lithium is equal to or below 0.5 ppm.

3. The synthetic quartz optical element according to claim 1,
  wherein no heterogeneity in the form of a layer is observed as a projected image or thin and dispersed stria in the projected image are barely visible when using pin hole light in a space between two parallel surfaces each having dimensions of 50 mm×20 mm of an optical element having dimensions of 50 mm×50 mm×20 mm.

4. A synthetic quartz optical element subject to irradiation of a laser beam having a wavelength shorter than 250 nm,
  wherein initial transmittance relative to light having a wavelength of 150 nm is equal to or above 60% per centimeter.

5. The synthetic quartz optical element according to claim 4,
  wherein a content of aluminum is equal to or below 1 ppm, and
  a content of lithium is equal to or below 0.5 ppm.

6. The synthetic quartz optical element according to claim 4,
  wherein no heterogeneity in the form of a layer is observed as a projected image or thin and dispersed stria in the projected image are barely visible when using pin hole light in a space between two parallel surfaces each having dimensions of 50 mm×20 mm of an optical element having dimensions of 50 mm×50 mm×20 mm.

7. A synthetic quartz optical element subject to irradiation of a laser beam having a wavelength shorter than 250 nm,
  wherein initial transmittance relative to light having a wavelength of 150 nm is equal to or above 60% per centimeter,
  no heterogeneity in the form of a layer is observed as a projected image or thin and dispersed stria in the projected image are barely visible when using pin hole light in a space between two parallel surfaces each having dimensions of 50 mm×20 mm of an optical element having dimensions of 50 mm×50 mm×20 mm.
  an absorption coefficient a for an infrared absorption band of a hydroxyl group located at 3585 cm$^{-1}$ is equal to or below 0.035/cm,
  a content of aluminum is equal to or below 1 ppm, and
  a content of lithium is equal to or below 0.5 ppm.

8. An exposure apparatus comprising:
  an illumination optical system configured to illuminate a mask by using a laser beam having a wavelength shorter than 250 nm as a light source; and
  a projection optical system configured to project and expose a pattern image of the mask onto an exposed substrate,
  wherein an optical element made of a synthetic quartz is disposed at least in any one of the illumination optical system and the projection optical system, the synthetic quartz optical element having initial transmittance relative to light having a wavelength of 150 nm, said initial transmittance being equal to or above 60% per centimeter.

9. The exposure apparatus according to claim 8,
  wherein the optical element made of the synthetic quartz member is applied to an optical integrator in the illumination optical system.

10. The exposure apparatus according to claim 8,
  wherein the optical element made of the synthetic quartz member is applied to at least any one of a phase shift component and a depolarizer in the illumination optical system.

11. The exposure apparatus according to claim 8,
  wherein at least 80% of optical elements made of a synthetic quartz member and disposed in the exposure apparatus have the absorption coefficient $\alpha$.

12. A method of manufacturing an exposure apparatus including an illumination optical system configured to illuminate a mask by using a laser beam having a wavelength shorter than 250 nm as a light source, and a projection optical system configured to project and expose a pattern image of the mask onto an exposed substrate, the method comprising the steps of:

selecting and preparing the optical element made of the synthetic quartz member the synthetic quartz member has an absorption coefficient α for an infrared absorption band of a hydroxyl group located at 3585 cm$^{-1}$ is equal to or below 0.035/cm and an initial transmittance relative to light having a wavelength of 150 nm is equal to or above 60% per centimeter;

preparing components other than the optical element made of the synthetic quartz member which are necessary for the exposure apparatus, and assembling the components necessary for the exposure apparatus together with the optical element made of the synthetic quartz member to obtain the exposure apparatus while disposing the optical element made of the synthetic quartz member at least in any one of the illumination optical system and the projection optical system.

13. The method of manufacturing an exposure apparatus according to claim 12, wherein the optical element made of the synthetic quartz member is applied to an optical integrator in the illumination optical system.

14. The method of manufacturing an exposure apparatus according to claim 12, wherein the optical element made of the synthetic quartz member is applied to at least any one of a phase shift component and a depolarizer in the illumination optical system.

15. The method of manufacturing an exposure apparatus according to claim 12, wherein at least 80% of optical elements made of a synthetic quartz member and disposed in the exposure apparatus have the absorption coefficient α.

16. An illumination optical system configured to illuminate a mask by using a laser beam having a wavelength shorter than 250 nm as a light source, wherein an optical element made of a synthetic quartz is disposed in the illumination optical system, the synthetic quartz optical element having initial transmittance relative to light having a wavelength of 150 nm, said initial transmittance being equal to or above 60% per centimeter.

17. The illumination optical system according to claim 16, wherein the synthetic quartz optical element is applied to an optical integrator.

18. The illumination optical system according to claim 16, wherein the synthetic quartz optical element is applied to at least any one of a phase shift component and a depolarizer.

19. A projection optical system configured to project and expose a pattern image of a mask by using a laser beam having a wavelength shorter than 250 nm as a light source, wherein an optical element made of synthetic quartz is disposed in the illumination optical system, the synthetic quartz optical element having initial transmittance relative to light having a wavelength of 150 nm, said initial transmittance being equal to or above 60% per centimeter.

* * * * *